United States Patent
Das et al.

(10) Patent No.: US 10,404,248 B2
(45) Date of Patent: *Sep. 3, 2019

(54) CALIBRATION OF A DUAL-PATH PULSE WIDTH MODULATION SYSTEM

(71) Applicant: Cirrus Logic International Semiconductor Ltd., Edinburgh (GB)

(72) Inventors: Tejasvi Das, Austin, TX (US); Alan Mark Morton, Austin, TX (US); Xin Zhao, Austin, TX (US); Lei Zhu, Austin, TX (US); Xiaofan Fei, Austin, TX (US); Johann G. Gaboriau, Austin, TX (US); John L. Melanson, Austin, TX (US); Amar Vellanki, Cedar Park, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/219,187

(22) Filed: Dec. 13, 2018

(65) Prior Publication Data

US 2019/0115909 A1    Apr. 18, 2019

Related U.S. Application Data

(63) Continuation of application No. 15/927,691, filed on Mar. 21, 2018, now Pat. No. 10,181,845.

(Continued)

(51) Int. Cl.
*H03K 7/08* (2006.01)
*H02M 3/157* (2006.01)
(Continued)

(52) U.S. Cl.
CPC ............... *H03K 7/08* (2013.01); *G06F 1/025* (2013.01); *H02M 3/157* (2013.01); *H03F 3/183* (2013.01);
(Continued)

(58) Field of Classification Search
CPC .......... H03K 7/08; G06F 1/025; H02M 3/157; H02M 2001/0012; H03F 3/2175; H03F 3/183
See application file for complete search history.

(56) References Cited

U.S. PATENT DOCUMENTS

| 9,762,255 B1 | 9/2017 | Satoskar et al. |
| 2011/0012674 A1 | 1/2011 | Midya et al. |
| 2012/0188111 A1 | 7/2012 | Ledzius et al. |

FOREIGN PATENT DOCUMENTS

WO    2016069319 A1    5/2016

OTHER PUBLICATIONS

Lu et al., "A 5V Output Voltage Boost Switching Converter with Hybrid Digital and Analog PWM Control", 2010 ACM/IEEE International Symposium on Low-Power Electronics and Design (ISLPED), 2010.

(Continued)

*Primary Examiner* — Vineeta S Panwalkar
(74) *Attorney, Agent, or Firm* — Jackson Walker L.L.P.

(57) ABSTRACT

A system may include a digital pulse width modulator subsystem, a first path coupled to an output of the digital pulse width modulator subsystem and configured to drive an open-loop driver stage, a second path coupled to the output of the digital pulse width modulator subsystem and configured to drive a closed-loop analog pulse width modulator, a controller to select between the first path and the second path for processing a signal based on one or more characteristics of the signal, and a calibration subsystem configured to calibrate at least one of a first gain of the first path and a second gain of the second path in order that the first gain and the second gain are at least approximately equal at the time of switching selection between the first path and the second path or vice versa, in order to minimize artifacts due to the switching.

17 Claims, 5 Drawing Sheets

Related U.S. Application Data

(60) Provisional application No. 62/573,514, filed on Oct. 17, 2017.

(51) Int. Cl.
 *G06F 1/025* (2006.01)
 *H03F 3/183* (2006.01)
 *H03F 3/217* (2006.01)
 *H02M 1/00* (2006.01)

(52) U.S. Cl.
 CPC ... *H03F 3/2175* (2013.01); *H02M 2001/0012* (2013.01)

(56) References Cited

OTHER PUBLICATIONS

International Search Report and Written Opinion of the International Searching Authority, International Application No. PCT/US2018/054186, dated Jan. 22, 2019.

CALIBRATION OF A DUAL-PATH PULSE WIDTH MODULATION SYSTEM

RELATED APPLICATIONS

The present disclosure is a continuation of U.S. Non-provisional patent application Ser. No. 15/927,691, filed Mar. 21, 2018, which claims priority to U.S. Provisional Patent Application Ser. No. 62/573,514, filed Oct. 17, 2017, each of which is incorporated by reference herein in its entirety.

FIELD OF DISCLOSURE

The present disclosure relates in general to circuits for audio and haptic devices, including without limitation personal audio devices, such as wireless telephones and media players, or devices comprising a haptic module.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches. In a class-D amplifier, a signal to be amplified may be converted to a series of pulses by pulse-width modulation, pulse-density modulation, or another method of modulation, such that the signal is converted into a modulated signal in which a characteristic of the pulses of the modulated signal (e.g., pulse widths, pulse density, etc.) is a function of the magnitude of the signal. After amplification with a class-D amplifier, the output pulse train may be converted to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers.

Typically, a closed-loop PWM amplifier is chosen in order to provide accurate load voltage with desirable Total Harmonic Distortion (THD) and Power Supply Rejection Ratio (PSRR). A closed-loop PWM amplifier typically takes an analog voltage input and a sensed feedback voltage signal which are fed through a closed-loop analog PWM modulator to drive voltage on the speaker load.

However, an option to alternatively drive loads using a single PWM amplifier circuit in either open-loop or closed-loop depending on the specific application may be desirable. When using such a single PWM amplifier circuit, perceptible audio artifacts may occur when switching between open-loop operation and closed-loop operation, and thus, it may be desirable to reduce or eliminate such audio artifacts.

SUMMARY

In accordance with the teachings of the present disclosure, one or more disadvantages and problems associated with existing approaches to processing signals with an amplifier may be reduced or eliminated.

In accordance with embodiments of the present disclosure, a system may include a digital pulse width modulator subsystem, a first path coupled to an output of the digital pulse width modulator subsystem and configured to drive an open-loop driver stage, a second path coupled to the output of the digital pulse width modulator subsystem and configured to drive a closed-loop analog pulse width modulator, wherein one of the first path and the second path is selected for processing a signal based on one or more characteristics of the signal, and a calibration subsystem configured to calibrate at least one of a first gain of the first path and a second gain of the second path in order that the first gain and the second gain are at least approximately equal at the time of switching selection between the first path and the second path or vice versa, in order to minimize artifacts due to the switching.

In accordance with these and other embodiments of the present disclosure, a method may be provided for use in a system comprising a digital pulse width modulator subsystem, a first path coupled to an output of the digital pulse width modulator subsystem and configured to drive an open-loop driver stage, and a second path coupled to the output of the digital pulse width modulator subsystem and configured to drive a closed-loop analog pulse width modulator, wherein one of the first path and the second path is selected for processing a signal based on one or more characteristics of the signal. The method may comprise calibrating at least one of a first gain of the first path and a second gain of the second path in order that the first gain and the second gain are at least approximately equal at the time of switching selection between the first path and the second path or vice versa, in order to minimize artifacts due to the switching.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
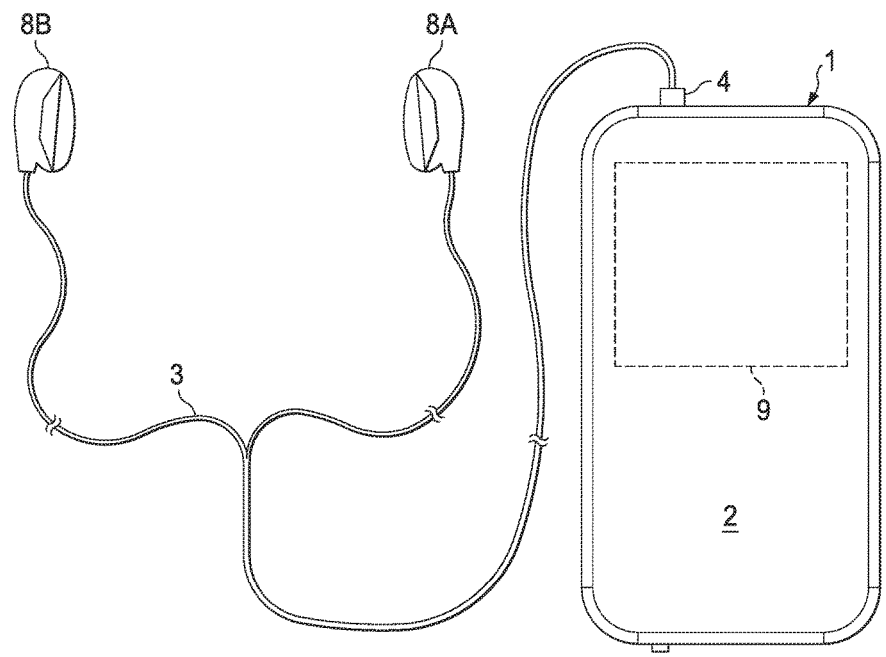
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer (e.g., a loudspeaker).

Figure 2:
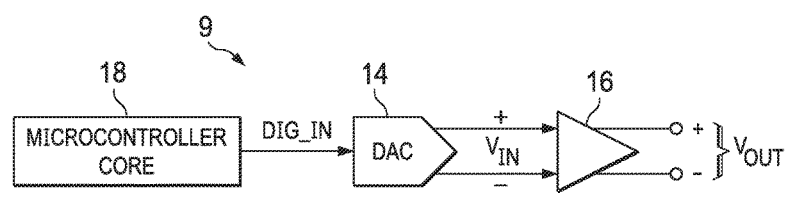
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 (e.g., a digital signal processor or "DSP") may supply a digital audio input signal DIG_IN to a digital-to-analog converter (DAC) 14, which may convert the digital audio input signal to an analog input signal $V_{IN}$. DAC 14 may supply analog signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output.

Figure 3:
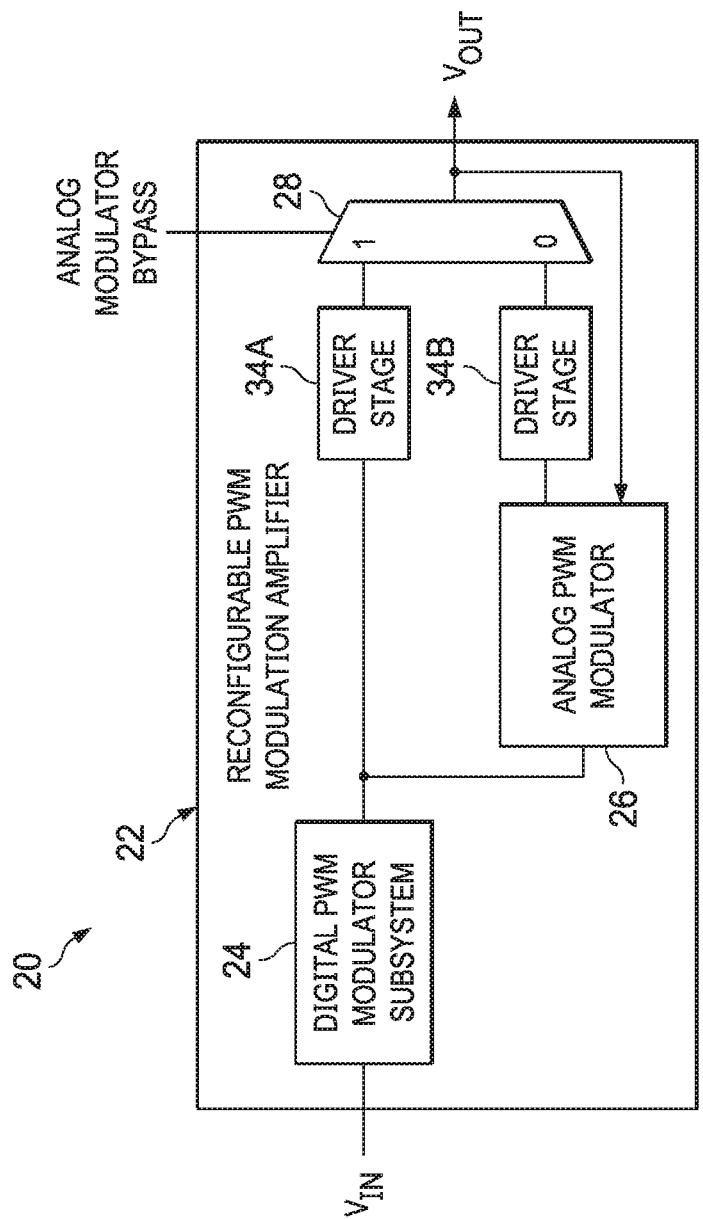
FIG. 3 is a block diagram of selected components of an example pulse width modulation amplifier, in accordance with embodiments of the present disclosure.

FIG. 3 is a block diagram of selected components of an example pulse width modulation amplifier 22, in accordance with embodiments of the present disclosure. In some embodiments, example pulse width modulation amplifier 22 may be used to implement amplifier 16 of FIG. 2. As shown in FIG. 3, example pulse width modulation amplifier 22 may include a digital PWM modulator subsystem 24 and an analog PWM modulator 26, along with a direct bypass function implemented with a multiplexer 28.

Reconfigurable PWM modulator 22 may be configured to operate in an analog closed-loop mode through the use of analog PWM modulator 26 when the ANALOG MODULATOR BYPASS control signal received by multiplexer 28 is disserted. In the analog closed-loop mode, input signal $V_{IN}$ may be modulated by digital PWM modulator subsystem 24, analog PWM modulator 26 may receive its input from digital PWM modulator subsystem 24, and analog PWM modulator 26 may be utilized such that the output of analog PWM modulator 26, as received and driven by driver stage 34B, is driven as output signal $V_{OUT}$. Driver stage 34B may comprise a plurality of output switches configured to generate output signal $V_{OUT}$ from a modulated signal generated by analog PWM modulator 26.

Reconfigurable PWM modulator 22 may also be configured to operate in a digital open-loop mode through the use of digital PWM modulator subsystem 24 when the ANALOG MODULATOR BYPASS control signal received by multiplexer 28 is asserted. In the digital open-loop mode, analog PWM modulator 26 and a driver stage 34B driven by analog PWM modulator 26 may be bypassed by multiplexer 28, and digital PWM modulator subsystem 24 may be utilized such that input signal $V_{IN}$ is modulated by digital PWM modulator subsystem 24 and the output of digital PWM modulator subsystem 24, as received and driven by an open-loop driver stage 34A, is driven as output signal $V_{OUT}$. Driver stage 34A may comprise a plurality of output switches configured to generate output signal $V_{OUT}$ from a modulated signal generated by digital PWM modulator subsystem 24.

Changing reconfigurable PWM modulator 22 from the analog closed-loop mode and the digital open-loop mode (and vice versa) may be achieved by, through use of multiplexer 28, selecting which of driver stage 34A and driver stage 34B is to drive output signal $V_{OUT}$.

In some embodiments, a control circuit (not shown) may be used to control multiplexer 28 in order to select a signal processing path for reconfigurable PWM modulator 22. For example, selection of such multiplexer control signal may be based on one or more characteristics of input signal $V_{IN}$ to the amplifier (e.g., magnitude, frequency, or other characteristic of input signal $V_{IN}$). Thus, reconfigurable PWM modulator 22 may comprise a digital pulse width modulator subsystem (e.g., digital PWM modulator subsystem 24), a first path coupled to an output of the digital pulse width modulator subsystem and configured to drive an open-loop driver stage (e.g., driver stage 34A), and a second path coupled to the output of the digital pulse width modulator subsystem and configured to drive a closed-loop analog pulse width modulator (e.g., analog PWM modulator 26), wherein one of the first path and the second path is selected for processing a signal based on one or more characteristics of the signal.

Advantageously, the foregoing provides systems and methods for implementing and using a system comprising a reconfigurable amplifier capable of switching between an analog closed-loop modulation amplifier and a digital open-loop modulation amplifier with minimal additional digital logic as compared to that of existing amplifier systems. However, the foregoing system may be susceptible to perceptible audio artifacts, such as "pops" and "clicks," unless steps are taken to reduce or avoid such artifacts. Accordingly, as described in greater detail below with respect to FIGS. 4-6, reconfigurable PWM modulator 22 may include a calibration subsystem configured to calibrate at least one of a first gain of a first path (open-loop path of digital PWM modulator sybsystem 24 and driver stage 34A) and a second gain of a second path (closed-loop path of analog PWM modulator 26) in order that the first gain and the second gain are approximately equal at the time of switching selection between the first path and the second path or vice versa, in order to minimize perceptible audio artifacts due to the switching.

Figure 4:
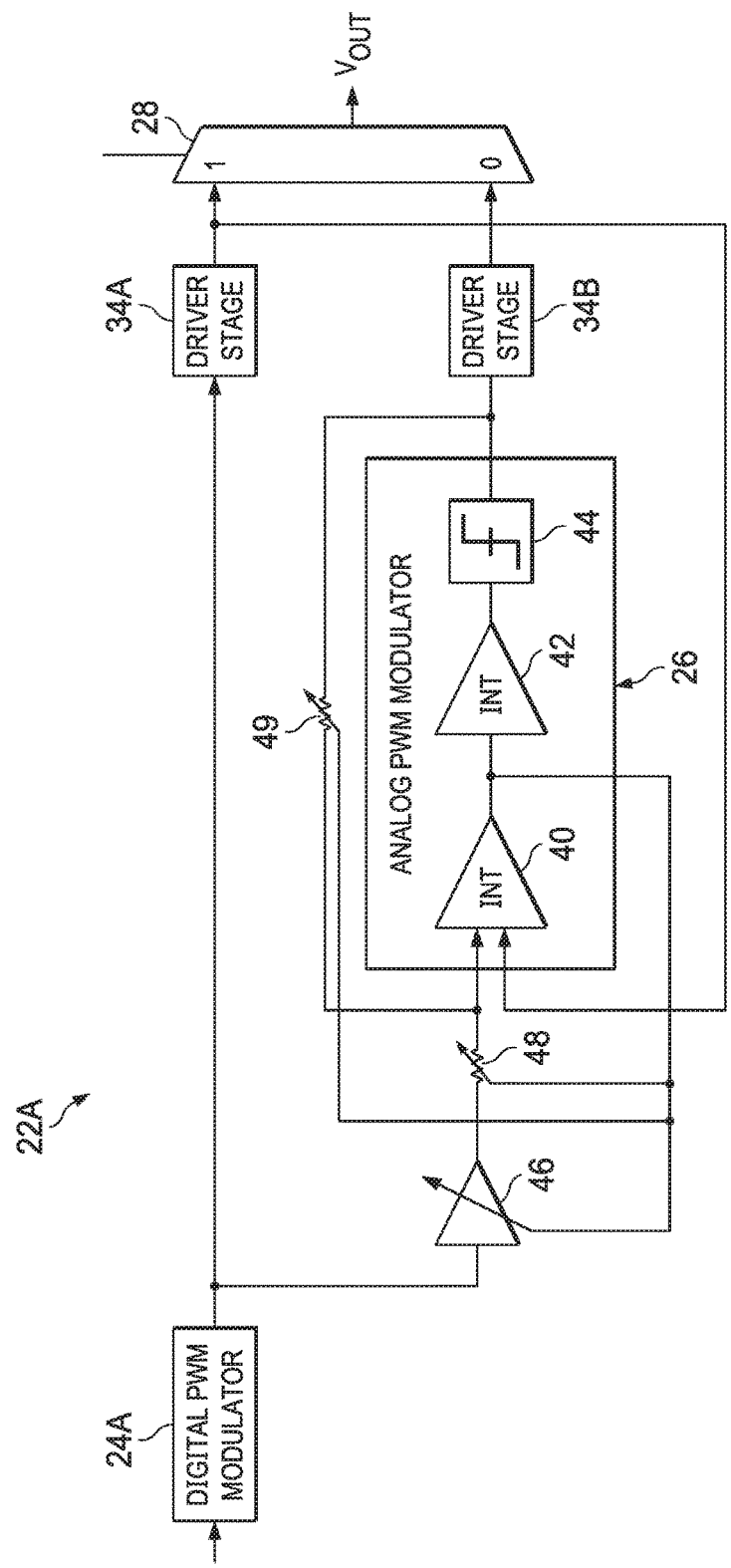
FIG. 4 is a block diagram of selected components of an example reconfigurable PWM modulator, including components for calibrating path gains, in accordance with embodiments of the present disclosure.

FIG. 4 is a block diagram of selected components of an example reconfigurable PWM modulator 22A, in accordance with embodiments of the present disclosure. In some embodiments, reconfigurable PWM modulator 22A may be used to implement reconfigurable PWM modulator 22 of FIG. 3. As shown in FIG. 4, a single digital PWM modulator 24A may be used to implement digital PWM modulator subsystem 24, and analog PWM modulator 26 may include a first-stage integrator 40 followed by one or more additional stage integrators 42, which are in turn followed by a quantizer 44 that may generate an analog PWM signal to driver stage 34B. A buffer 46 may be interfaced between digital PWM modulator 24A and analog PWM modulator 26 to buffer a digital PWM signal generated by digital PWM modulator 24A to the input of analog PWM modulator 26. Gain resistors 48 and 49 may also be present to define a gain of analog PWM modulator 26.

As shown in FIG. 4, the gain of buffer 46, gain resistor 48, and/or gain resistor 49 may be variable. When calibration is enabled, first-stage integrator 40 of analog PWM modulator 26 may be re-used as a filter and comparator combination for detecting a gain of the open-loop path including driver stage 34A. Because one input to the comparator implemented using first-stage integrator 40 is the digital signal generated by digital PWM modulator 24A (or in alternative embodiments, the input signal to digital PWM modulator 24A) and the other input to the comparator implemented using first-stage integrator 40 is the output of driver stage 34A, the output of first-stage integrator 40, when calibration is enabled, is indicative of the gain of the open-loop path. Such detected gain may then be used to appropriately set a gain of buffer 46, a resistance of gain resistor 48, and/or a resistance of gain resistor 49, so as to match the gain of the closed-loop path including analog PWM modulator 26 to the gain of the open-loop path.

Figure 5:
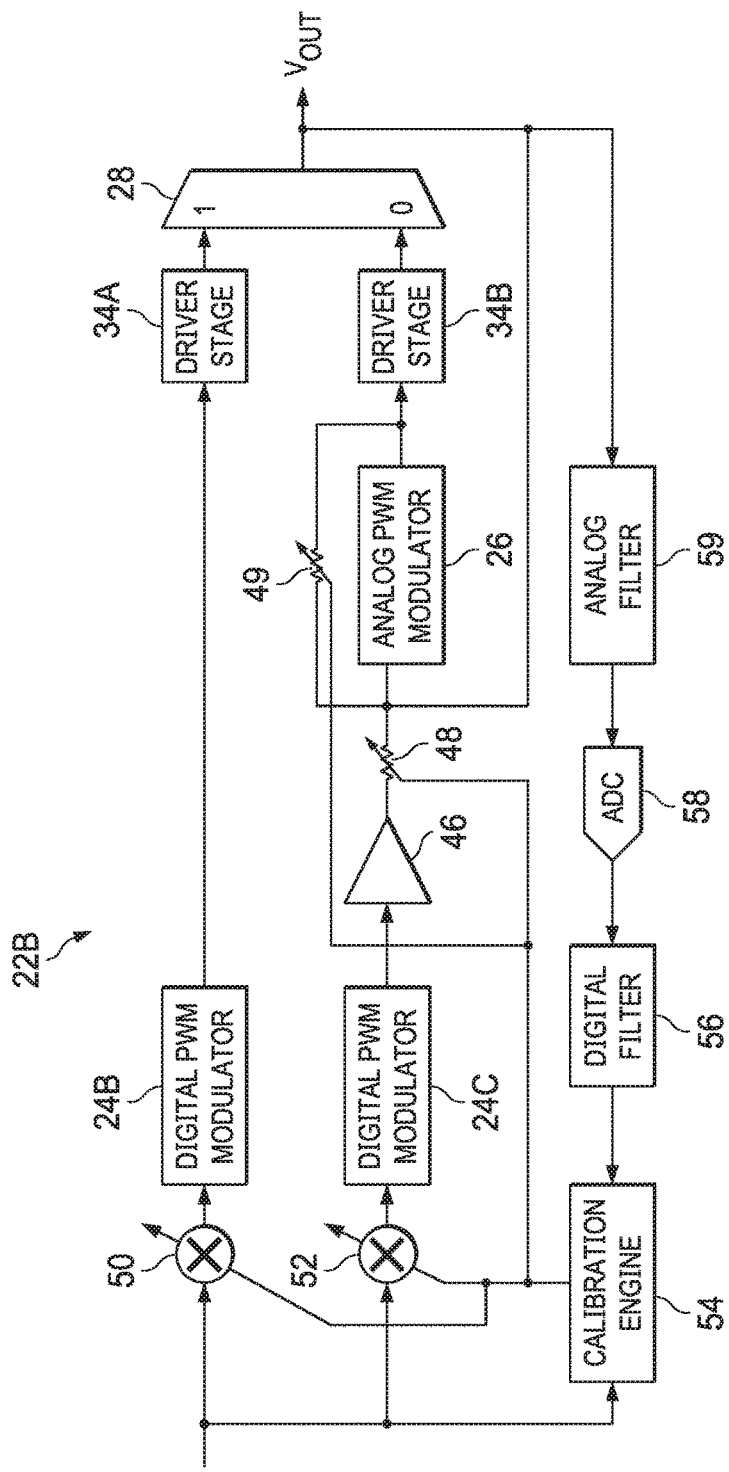
FIG. 5 is a block diagram of selected components of another example reconfigurable PWM modulator, including components for calibrating path gains, in accordance with embodiments of the present disclosure.

FIG. 5 is a block diagram of selected components of an example reconfigurable PWM modulator 22B, in accordance with embodiments of the present disclosure. In some embodiments, reconfigurable PWM modulator 22B may be used to implement reconfigurable PWM modulator 22 of FIG. 3. As shown in FIG. 5, digital PWM modulation subsystem 24 of FIG. 2 may be implemented using a first digital PWM modulator 24B and a second digital PWM modulator subsystem 24C. Digital PWM modulator 24B may drive open-loop driver stage 34A while digital PWM modulator 24C may drive analog PWM modulator 26 via a buffer 46 configured to buffer a digital PWM signal generated by digital PWM modulator 24C to the input of analog PWM modulator 26. Gain resistors 48 and 49 may also be present to define a gain of analog PWM modulator 26.

Also as shown in FIG. 5, a gain element 50 may interface between the input to reconfigurable PWM modulator 22B and digital PWM modulator 24B and a gain element 52 may interface between the input to reconfigurable PWM modulator 22B and digital PWM modulator 24C. Gain element 50 may apply a coarse gain setting to the open-loop path while gain element 52 may apply a smaller fine gain setting to the closed-loop path. A calibration engine 54 may detect output signal $V_{OUT}$ as filtered by an analog filter 59, converted from the analog domain to the digital domain by ADC 58, and filtered by digital filter 56. Such filtering may ensure that calibration is performed based only upon in-band signal content. Calibration engine 54 may also sense the input signal to allow it to compare the input signal to the digital domain representation of output signal $V_{OUT}$ in order to determine a gain of the open-loop path. Although not shown, digital filtering similar to that of output signal $V_{OUT}$ may be performed on the input signal prior to receipt by calibration engine 54, and the input signal and output signal $V_{OUT}$ may also be delay matched to properly measure gain. Based on the determined gain, calibration engine 54 may calibrate gain element 50 and/or gain element 52 in the digital domain prior to digital modulation such that the open-loop path and closed-loop path have the same path gain. In some embodiments, calibration engine 54 may also be able to vary a resistance of gain resistor 48 and/or a resistance of gain resistor 49 in order to calibrate gains of the open-loop path and the closed-loop path.

In operation, the calibration system shown in FIG. 5 may calibrate on actual playback content represented by the input signal or based on an inaudible pilot tone which may be used only for calibration.

Figure 6:
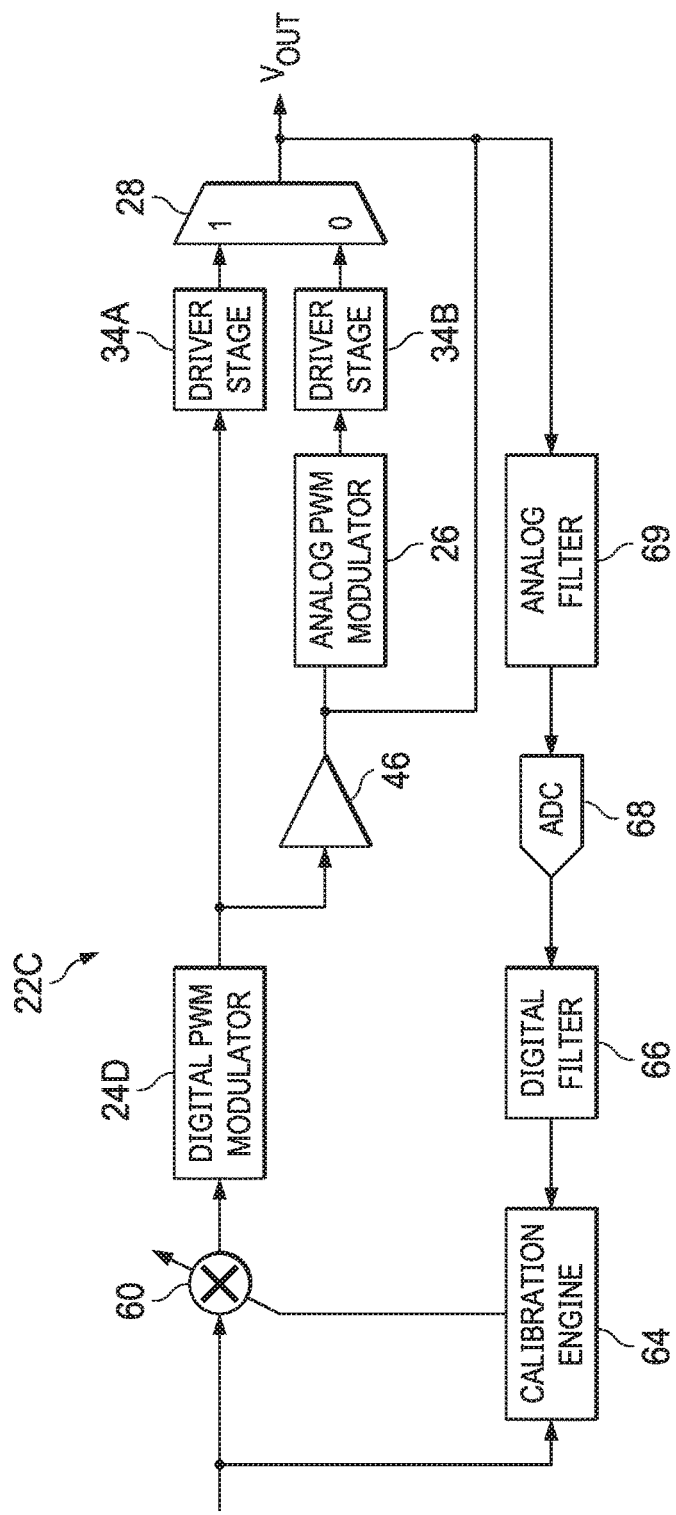
FIG. 6 is a block diagram of selected components of another example reconfigurable PWM modulator, including components for calibrating path gains, in accordance with embodiments of the present disclosure.

FIG. 6 is a block diagram of selected components of an example reconfigurable PWM modulator 22C, in accordance with embodiments of the present disclosure. In some embodiments, reconfigurable PWM modulator 22C may be used to implement reconfigurable PWM modulator 22 of FIG. 3. As shown in FIG. 6, digital PWM modulation subsystem 24 of FIG. 2 may be implemented using a single digital PWM modulator 24D. Digital PWM modulator 24D may drive open-loop driver stage 34A while digital PWM modulator 24D may drive analog PWM modulator 26 via a buffer 46 configured to buffer a digital PWM signal generated by digital PWM modulator 24C to the input of analog PWM modulator 26.

Also as shown in FIG. 6, a gain element 60 may interface between the input to reconfigurable PWM modulator 22C and digital PWM modulator 24D. Gain element 60 may apply a variable gain to the input signal before modulation by PWM modulator 22C. A calibration engine 64 may detect output signal $V_{OUT}$ as filtered by an analog filter 69, converted from the analog domain to the digital domain by ADC 68, and filtered by digital filter 66. Such filtering may ensure that calibration is performed based only upon in-band signal content. Calibration engine 64 may also sense the input signal to allow it to compare the input signal to the digital domain representation of output signal $V_{OUT}$ in order to determine a gain of the open-loop path. Although not shown, digital filtering similar to that of output signal $V_{OUT}$ may be performed on the input signal prior to receipt by calibration engine 64, and the input signal and output signal $V_{OUT}$ may also be delay matched to properly measure gain. Based on the determined gain, calibration engine 64 may calibrate gain element 60 in the digital domain prior to digital modulation such that the open-loop path and closed-loop path have the same path gain.

The gain calibration performed in accordance herein may ensure that a first gain of the open-loop path and a second gain of the closed-loop path are approximately equal at the time of switching selection between the open-loop path and the closed-loop path or vice versa, in order to minimize artifacts due to the switching.

The gain calibration performed in accordance herein may be undertaken at any suitable time. For example, in some embodiments, the calibration subsystem disclosed herein may be configured to calibrate gain during product testing of reconfigurable PWM modulator 22 or a device in which reconfigurable PWM modulator 22 resides, such that the calibration is performed once prior to its end use. As another example, the calibration subsystem disclosed herein may be configured to calibrate gain in real-time while audio content of the input signal is being played back. As a specific example of real-time calibration, as depicted in FIGS. 5 and 6, a calibration subsystem may be configured to, when the open-loop path is selected, detect an output of the open-loop path in order to calibrate gain.

In these and other embodiments, the calibration subsystem may be configured to perform calibration in a series of steps while audio content of the input signal is being played back in order to minimize user perceptible audio artifacts. For example, if the calibration subsystem determines that a gain should be changed by a factor of x, the calibration subsystem may change the gain in a series of y steps, wherein during each step, gain is changed by an amount x/y. In some of such embodiments, the calibration subsystem is further configured to transition between consecutive steps of the series of steps at one of a zero crossing of the input signal and a zero crossing of a pulse width modulation signal derived from the input signal within the system.

In these and other embodiments, the calibration subsystem may be further configured to receive a temperature signal indicative of a temperature associated with reconfigurable PWM modulator 22 (e.g., from a temperature sensor, not shown) and calibrate gain by applying a correction factor to one or more of the path gains.

In these and other embodiments, the calibration subsystem may be enabled to perform calibration at intermittent periods. For example, the calibration subsystem may perform calibration for a period of time and cease calibration for another period of time before again calibrating. As another example, the calibration subsystem may enable calibration of at least one of the first gain and the second gain in response to a change in the temperature.

In these and other embodiments, the calibration subsystem may further be configured to enable gain calibration only if an input signal (e.g., an input signal to reconfigurable PWM modulator) is above a threshold magnitude. In such embodiments, the calibration subsystem further may be configured to abort gain if the input signal falls below the threshold magnitude during a calibration process.

In these and other embodiments, the calibration subsystem may further be configured to enable gain calibration only if the open-loop path is selected for processing. In such embodiments, the calibration subsystem may further be configured to abort gain calibration if the closed-loop path is selected for processing at any time during the calibration process.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A system comprising:
a digital pulse width modulator subsystem;
a first path coupled to an output of the digital pulse width modulator subsystem and configured to drive an open-loop driver stage;
a second path coupled to the output of the digital pulse width modulator subsystem and configured to drive a closed-loop analog pulse width modulator, wherein one of the first path and the second path is selected for processing a signal based on one or more characteristics of the signal; and
a calibration subsystem configured to:
perform calibration at intermittent periods in order to cause a first gain of the first path and a second gain of the second path to be approximately equal at the time of switching selection between the first path and the second path or vice versa, in order to minimize artifacts due to the switching;
receive a temperature signal indicative of a temperature of the system; and
enable calibration of at least one of the first gain and the second gain in response to a change in the temperature by at least a minimum amount of temperature.

2. The system of claim 1, wherein the digital pulse width modulator subsystem comprises:
a first digital pulse width modulator configured to drive the first path; and
a second digital pulse width modulator configured to drive the second path.

3. The system of claim 1, wherein the digital pulse width modulator subsystem comprises a single pulse width modulator that drives both the first path and the second path.

4. The system of claim 1, wherein the calibration subsystem is further configured to detect the first gain in an analog domain.

5. The system of claim 4, wherein the calibration subsystem is further configured to use an integrator of the closed-loop analog pulse width modulator to detect the gain of the first path.

6. The system of claim 4, wherein the calibration subsystem is further configured to detect the second gain in an analog domain.

7. The system of claim 6, wherein the calibration subsystem is further configured to calibrate the gain of either the first, second or both gains in the analog domain.

8. The system of claim 6, wherein the calibration subsystem is further configured to calibrate the gain of either the first, second or both gains in a digital domain.

9. The system of claim 1, wherein the calibration subsystem is further configured to detect at least one of the first gain and the second gain in a digital domain by using an analog-to-digital converter.

10. The system of claim 9, wherein the calibration subsystem calibrates the gain of either the first, second or both gains in the digital domain.

11. The system of claim 1, wherein the calibration subsystem is configured to calibrate at least one of the first gain and the second gain during product testing of the system.

12. The system of claim 1, wherein the calibration subsystem is configured to calibrate at least one of the first gain and the second gain in real-time while audio content of the signal is being played back to a transducer.

13. The system of claim 12, wherein the calibration subsystem is configured to, when the first path is active, detect an output of the first path in order to calibrate at least one of the first gain and the second gain.

14. The system of claim 12, wherein the calibration subsystem is configured to perform calibration in a series of steps while audio content of the signal is being played back to the transducer in order to minimize user perceptible audio artifacts.

15. The system of claim 14, wherein the calibration subsystem is further configured to transition between consecutive steps of the series of steps at one of a zero crossing of the input signal and a zero crossing of a pulse width modulation signal derived from the input signal within the system.

16. A system comprising:
a digital pulse width modulator subsystem;
a first path coupled to an output of the digital pulse width modulator subsystem and configured to drive an open-loop driver stage;
a second path coupled to the output of the digital pulse width modulator subsystem and configured to drive a closed-loop analog pulse width modulator, wherein one of the first path and the second path is selected for processing a signal based on one or more characteristics of the signal; and
wherein, for a portion of a signal spectrum of the signal, a first gain of the first path and a second gain of the second path are approximately equal at the time of switching selection between the first path and the second path or vice versa, in order to minimize artifacts due to the switching.

17. A system comprising:
a digital pulse width modulator subsystem;
a first path coupled to an output of the digital pulse width modulator subsystem and configured to drive an open-loop driver stage;
a second path coupled to the output of the digital pulse width modulator subsystem and configured to drive a closed-loop analog pulse width modulator, wherein one of the first path and the second path is selected for processing a signal based on one or more characteristics of the signal; and
a calibration subsystem configured to disable calibration of at least one of the first gain and the second gain if the input signal is below a threshold magnitude.

* * * * *

UNITED STATES PATENT AND TRADEMARK OFFICE
CERTIFICATE OF CORRECTION

| | | |
|---|---|---|
| PATENT NO. | : 10,404,248 B2 | Page 1 of 1 |
| APPLICATION NO. | : 16/219187 | |
| DATED | : September 3, 2019 | |
| INVENTOR(S) | : Das et al. | |

It is certified that error appears in the above-identified patent and that said Letters Patent is hereby corrected as shown below:

In the Specification

1. In Column 3, Line 65, delete "disserted." and insert -- deasserted. --, therefor.

Signed and Sealed this
Third Day of March, 2020

Andrei Iancu
*Director of the United States Patent and Trademark Office*